(12) United States Patent
Matsui et al.

(10) Patent No.: US 9,207,286 B2
(45) Date of Patent: Dec. 8, 2015

(54) BATTERY DIAGNOSIS DEVICE AND METHOD

(71) Applicant: Kabushiki Kaisha Toshiba, Tokyo (JP)

(72) Inventors: Akihiro Matsui, Nagano-ken (JP); Kazuto Kuroda, Tokyo (JP); Yasuhiro Harada, Kanagawa-ken (JP); Shinichiro Kosugi, Nagano-ken (JP); Hisashi Oya, Tokyo (JP); Mami Mizutani, Tokyo (JP); Takashi Morimoto, Tokyo (JP); Takeo Hayase, Kanagawa-ken (JP); Yukitaka Monden, Kanagawa-ken (JP); Norio Takami, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 14/084,714

(22) Filed: Nov. 20, 2013

(65) Prior Publication Data

US 2014/0103934 A1    Apr. 17, 2014

Related U.S. Application Data

(62) Division of application No. 12/974,828, filed on Dec. 21, 2010.

(30) Foreign Application Priority Data

Dec. 25, 2009  (JP) ................................. 2009-295627

(51) Int. Cl.
*H02J 7/00* (2006.01)
*G01R 31/36* (2006.01)
*H01M 10/48* (2006.01)
*G06Q 50/06* (2012.01)
(Continued)

(52) U.S. Cl.
CPC ........... *G01R 31/3634* (2013.01); *B60L 3/0046* (2013.01); *B60L 3/04* (2013.01); *B60L 3/12* (2013.01); *B60L 11/1853* (2013.01);
(Continued)

(58) Field of Classification Search
CPC .... H02J 7/007; H01M 10/44; G01R 31/3648; G01R 31/3662; G01R 31/3679
USPC ................... 320/130, 132, 134; 324/427, 430
See application file for complete search history.

(56) References Cited

U.S. PATENT DOCUMENTS 6,480,003 B1 *  11/2002  Ugaji et al. .................... 324/430
2009/0096459 A1 *  4/2009  Yoneda et al. ................ 324/430

FOREIGN PATENT DOCUMENTS

JP          08-254573        1/1996
JP          2000-131404      12/2000
JP          2009-219215      9/2009

*Primary Examiner* — Edward Tso
*Assistant Examiner* — Aaron Piggush
(74) *Attorney, Agent, or Firm* — Baker Botts L.L.P.

(57) ABSTRACT

An apparatus is disclosed that includes a resistance measuring unit operable to determine a solution resistance Rsol and a charge transfer resistance Rct of a battery; and at least one computer-readable non-transitory storage medium comprising code, that, when executed by at least one processor, is operable to provide an estimate of the present value of the battery by: comparing Rsol and Rct to historical deterioration transition information; estimating the number of remaining charge cycles before a discharge capacity lower limit is reached by the battery using the comparison; and estimating the number of remaining charge cycles before a discharge time lower limit is reached by the battery using the comparison. The estimate of the present value of the battery includes the smaller of the number of remaining charge cycles before a discharge capacity lower limit is reached or the number of remaining charge cycles before a discharge time lower limit is reached.

6 Claims, 14 Drawing Sheets

(51) Int. Cl.
*B60L 3/00* (2006.01)
*B60L 3/04* (2006.01)
*B60L 3/12* (2006.01)
*B60L 11/18* (2006.01)

(52) U.S. Cl.
CPC ......... *B60L11/1861* (2013.01); *B60L 11/1864* (2013.01); *G01R 31/3651* (2013.01); *G01R 31/3679* (2013.01); *G01R 31/3689* (2013.01); *G06Q 50/06* (2013.01); *H01M 10/48* (2013.01); *B60L 2240/545* (2013.01); *B60L 2240/547* (2013.01); *B60L 2240/549* (2013.01); *G01R 31/3658* (2013.01); *G01R 31/3662* (2013.01); *H01M 2220/20* (2013.01); *Y02T 10/7005* (2013.01); *Y02T 10/7044* (2013.01); *Y02T 10/7061* (2013.01)

| ITEM |
|---|
| HISTORY DATA ID |
| MEASUREMENT DATE |
| Rct |
| Rsol |
| PACK TEMPERATURE |
| MODULE TEMPERATURE |
| PACK VOLTAGE |
| CELL VOLTAGE |

*FIG. 6*

| 4C CAPACITY | PATTERN A | PATTERN B | PATTERN C |
| --- | --- | --- | --- |
| A YEAR | 10 | 9 | 8 |
| 2 YEARS | 9 | (7) | 6 |
| 3 YEARS | 8 | 4 | 4 |
| 4 YEARS | 7 | 2 | 2 |
| 5 YEARS | 6 | 1 | 1 |

| 1C CAPACITY | PATTERN A | PATTERN B | PATTERN C |
| --- | --- | --- | --- |
| A YEAR | 10 | 9 | 8 |
| 2 YEARS | (9) | 8 | 6 |
| 3 YEARS | 8 | 7 | 4 |
| 4 YEARS | 7 | 6 | 2 |
| 5 YEARS | 6 | 5 | 1 |

| Rct | PATTERN A | PATTERN B | PATTERN C |
| --- | --- | --- | --- |
| A YEAR | 10 | 9 | 8 |
| 2 YEARS | 9 | (7) | 3 |
| 3 YEARS | 8 | 5 | 2 |
| 4 YEARS | 7 | 4 | 1 |
| 5 YEARS | 6 | 3 | 0 |

| 8C CAPACITY | PATTERN A | PATTERN B | PATTERN C |
| --- | --- | --- | --- |
| A YEAR | 10 | 10 | 8 |
| 2 YEARS | (9) | 7 | 6 |
| 3 YEARS | 8 | 5 | 4 |
| 4 YEARS | 7 | 4 | 2 |
| 5 YEARS | 6 | 3 | 1 |

| 2C CAPACITY | PATTERN A | PATTERN B | PATTERN C |
| --- | --- | --- | --- |
| A YEAR | 10 | 9 | 8 |
| 2 YEARS | 9 | 7 | (6) |
| 3 YEARS | 8 | 5 | 4 |
| 4 YEARS | 7 | 4 | 2 |
| 5 YEARS | 6 | 3 | 1 |

| Rsd | PATTERN A | PATTERN B | PATTERN C |
| --- | --- | --- | --- |
| A YEAR | 10 | 9 | 8 |
| 2 YEARS | 9 | 8 | (5) |
| 3 YEARS | 8 | 7 | 4 |
| 4 YEARS | 7 | 6 | 3 |
| 5 YEARS | 6 | 5 | 2 |

FIG. 12

|  | 8C CAPACITY | 4C CAPACITY | 2C CAPACITY | 1C CAPACITY | Rct | Rsol |
|---|---|---|---|---|---|---|
| for EV | 1.0 | 0.5 | 0.2 | 0.1 | 1.0 | 1.0 |
| for HOUSEHOLD | 0.5 | 0.5 | 0.3 | 0.2 | 0.8 | 0.9 |
| for MOTO | 0.4 | 0.5 | 0.3 | 0.3 | 0.5 | 0.8 |

FIG. 13

BATTERY DIAGNOSIS DEVICE AND METHOD

CROSS-REFERENCE TO RELATED APPLICATIONS

This application is a divisional of application Ser. No. 12/974,828 filed on Dec. 21, 2010, which is based upon and claims the benefit of priority from Japanese Patent Application No. 2009295627, filed on Dec. 25, 2009, the entire contents of which are incorporated herein by reference.

TECHNICAL FIELD

The present disclosure relates to a technique and apparatus for determining the deterioration state and the present value of a battery.

BACKGROUND

A battery mounted in an electric vehicle (EV) is expensive, and the ratio of the price of such a battery to the price of an electric vehicle is higher than the ratio of the price of a battery to an electronic device such as a notebook computer or a portable telephone. For example, some people point out that the biggest factor in the high costs of electric vehicles is the expensive batteries. Therefore, when electric vehicles are put on a secondhand car market, it is essential to know the present price of each battery.

However, the degrees of deterioration of batteries vary with the states of usage, and the values of those batteries cannot be calculated simply from the age of service or the number of charge and discharge cycles. Therefore, it is difficult to set the present price of each battery on a secondhand car market or the like.

To counter this problem, there have been various kinds of suggestions made about methods of determining the degree of deterioration of a battery.

For instance, methods of determining the degree of deterioration of a battery using the internal resistance of the battery have been proposed. In other proposals, the present capacity of a battery is determined from the cumulative value of charged/discharged current, and the ratio of the present capacity to the initial battery capacity is calculated to determine the degree of deterioration.

However, a battery's internal resistance components that affect the battery capacity and power are not only the DC resistance that is the resistance components of an electrolytic solution. Therefore, it is difficult to predict a future deterioration tendency by a determination method using only the DC resistance components.

Also, if the histories (the deterioration patterns) that indicate how batteries with the same battery capacities have deteriorated differ from each other, the deterioration states in the future will not necessarily be the same as each other. Therefore, a present value determined only from the degree of deterioration based on the battery capacity can be unreliable.

Normally, a battery to be mounted in an electric vehicle is required to show high performance such as a large current and a large capacity, compared with batteries to be used for other purposes. Therefore, batteries that have been used in vehicles but no longer satisfy those high requirements might still sufficiently fulfill other purposes.

Since batteries that are already useless in vehicles can be useful for other purposes, the present price of each battery needs to be determined by taking into consideration the purpose of future use of the battery.

As described above, there is a demand for a method of determining the deterioration state of a battery with high precision and a rational indicator of the present value of the battery according to the purpose of future use.

SUMMARY

In some embodiments, an apparatus is disclosed that includes a resistance measuring unit operable to determine a solution resistance Rsol and a charge transfer resistance Rct of a battery; and at least one computer-readable non-transitory storage medium comprising code, that, when executed by at least one processor, is operable to provide an estimate of the present value of the battery by: comparing Rsol and Rct to historical deterioration transition information; estimating the number of remaining charge cycles before a discharge capacity lower limit is reached by the battery using the comparison; and estimating the number of remaining charge cycles before a discharge time lower limit is reached by the battery using the comparison.

The apparatus may also include an AC oscillator that sweeps AC voltages at a plurality of frequencies and applies the AC voltages to both ends of at least one battery; and a voltage measuring unit and a current measuring unit that respectively measure a voltage change and a current change caused at the both ends of the at least one battery at each of the frequencies, wherein the resistance component determining unit determines an impedance of the battery at each frequency as a complex representation from the measured voltage change and the measured current change at each of the frequencies, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation.

The apparatus may also include an AC oscillator that applies AC voltages having sine waves superimposed thereon at a plurality of frequencies, to both ends of at least one battery; and a voltage measuring unit and a current measuring unit that respectively measure a voltage change and a current change caused at the both ends of the at least one battery with the applied AC voltages, wherein the resistance component determining unit determines an impedance of the battery at each frequency as a complex representation by performing Fourier transformations on waveforms of the voltage change and the current change, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation.

The apparatus may also include a charge-discharge unit that performs charging and discharging on a battery pack containing at least one battery, wherein, in determining $R_{SOL}$ and $R_{CT}$, the resistance component determining unit controls the charge-discharge unit to adjust a state of charge SOC of the battery pack to approximately 50%. The estimate of the present value of the battery comprises the smaller of the number of remaining charge cycles before a discharge capacity lower limit is reached or the number of remaining charge cycles before a discharge time lower limit is reached.

The apparatus may also include an AC oscillator that sweeps AC voltages at a plurality of frequencies and applies the AC voltages to both ends of at least one battery; and a voltage measuring unit and a current measuring unit that respectively measure a voltage change and a current change caused at the both ends of the at least one battery at each of the frequencies, wherein the resistance component determining unit determines an impedance of the battery at each frequency as a complex representation from the measured voltage change and the measured current change at each of the frequencies, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation.

The apparatus may also include an AC oscillator that applies AC voltages having sine waves superimposed thereon at a plurality of frequencies, to both ends of at least one battery; and a voltage measuring unit and a current measuring unit that respectively measure a voltage change and a current change caused at the both ends of the at least one battery with the applied AC voltages, wherein the resistance component determining unit determines an impedance of the battery at each frequency as a complex representation by performing Fourier transformations on waveforms of the voltage change and the current change, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation.

In other embodiments, an apparatus is disclosed that includes a resistance component determining unit that determines a solution resistance ($R_{SOL}$) and a charge transfer resistance ($R_{CT}$) of a battery; a charge-discharge unit that performs step-down charging and discharging on a battery pack containing the at least one battery; a battery capacity determining unit that determines battery capacities at respective C rates by operating the charge-discharge unit and controlling charging and discharging with a plurality of currents; and a present value indicator calculating unit that acquires history information containing the battery capacities at the respective C rates representing characteristics of the battery and $R_{SOL}$ and $R_{CT}$, compares the history information with reference deterioration data to select deterioration data most similar to the reference deterioration data, turns a present deterioration state of the battery into numerical values with respect to the respective characteristics based on the selected deterioration data, weights the numerical values with coefficients according to a purpose of future use to generate new numerical values, and adds up the new numerical values to generate a present value indicator of the battery.

The apparatus may also include an AC oscillator that sweeps AC voltages at a plurality of frequencies and applies the AC voltages to both ends of at least one battery; and a voltage measuring unit and a current measuring unit that respectively measure a voltage change and a current change caused at the both ends of the at least one battery at each of the frequencies, wherein the resistance component determining unit determines an impedance of the battery at each frequency as a complex representation from the measured voltage change and the measured current change at each of the frequencies, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation. The apparatus may also include an AC oscillator that applies AC voltages having sine waves superimposed thereon at a plurality of frequencies, to both ends of at least one battery; and a voltage measuring unit and a current measuring unit that respectively measure a voltage change and a current change caused at the both ends of the at least one battery with the applied AC voltages, wherein the resistance component determining unit determines an impedance of the battery at each frequency as a complex representation by performing Fourier transformations on waveforms of the voltage change and the current change, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation.

In other embodiments, an apparatus is disclosed that includes a resistance component determining unit that determines a solution resistance $R_{SOL}$ and a charge transfer resistance $R_{CT}$ of a battery; a charge unit that performs step-down charging on a battery pack containing the at least one battery; a time information acquiring unit that controls charging with a plurality of step-down currents by operating the charge unit, and acquires information about time from an end of charging with a first current to an end of charging with a last current; and a present value indicator calculating unit that acquires history information containing the time information representing characteristics of the battery and $R_{SOL}$ and $R_{CT}$, compares the history information with reference deterioration data to select deterioration data that is the most similar to the reference deterioration data, turns a present deterioration state of the battery into numerical values with respect to the respective characteristics based on the selected deterioration data, weights the numerical values with coefficients according to a purpose of future use to generate new numerical values, and adds up the new numerical values to generate a present value indicator of the battery.

In other embodiments, a battery pack is disclosed that includes a battery module that has at least a plurality of batteries connected in series; a voltage and temperature measuring unit that measures voltages and temperatures of the batteries; a communication terminal that connects communication lines for exchanging information with a diagnosis device; a first terminal that connects lines extending from both ends of the at least one battery; a second terminal that connects lines extending from both ends of the battery module; and line conduction holes for connecting to both ends of the at least one battery being formed in an exterior of the battery module. The battery capacities and $R_{SOL}$ and $R_{CT}$ are acquired from the connected diagnosis device via the communication terminal, and the battery capacities, $R_{SOL}$ and $R_{CT}$, and temperature information measured by the voltage and temperature measuring unit are stored as history information in a memory. The time information and $R_{SOL}$ and $R_{CT}$ are acquired from the connected diagnosis device via the communication terminal, the time information, $R_{SOL}$ and $R_{CT}$, and temperature information measured by the voltage and temperature measuring unit are stored as history information in a memory, and the time information is information about time from an end of charging with a first current to an end of charging with a last current, the time information being acquired by the diagnosis device controlling charging of the battery with a plurality of step-down currents.

In other embodiments, a method is disclosed that includes accumulating history information by connecting a diagnosis device to a battery and acquiring battery capacities at respective C rates and $R_{SOL}$ and $R_{CT}$; acquiring the history information containing the battery capacities at the respective C rates representing characteristics of the battery and $R_{SOL}$ and $R_{CT}$, comparing the history information with reference deterioration data to select deterioration data most similar to the reference deterioration data, and turning a present deterioration state of the battery into numerical values with respect to the respective characteristics, based on the selected deterioration data; and weighting the numerical values with coefficients according to a purpose of future use, and adding up the new numerical values to create an indicator of a present value of the battery.

In other embodiments, a method is disclosed that includes accumulating history information by connecting a diagnosis device to a battery and acquiring time information and $R_{SOL}$ and $R_{CT}$; acquiring the history information containing the time information representing characteristics of the battery and $R_{SOL}$ and $R_{CT}$, comparing the history information with reference to deterioration data to select deterioration data most similar to the reference deterioration data, and turning a present deterioration state of the battery into numerical values with respect to the respective characteristics, based on the selected deterioration data; and weighting the numerical values with coefficients according to a purpose of future use, and adding up the new numerical values to create an indicator of a present value of the battery, the time information being information about time from an end of charging with a first current to an end of charging with a last current, the time information being acquired by the diagnosis device controlling charging of the battery with a plurality of step-down currents.

In other embodiments, a method is disclosed that includes determining a solution resistance Rsol and a charge transfer resistance Rct of a battery; and providing an estimate of the present value of the battery by: comparing Rsol and Rct to historical deterioration transition information; estimating the number of remaining charge cycles before a discharge capacity lower limit is reached by the battery using the comparison; and estimating the number of remaining charge cycles before a discharge time lower limit is reached by the battery using the comparison. The estimate of the present value of the battery comprises the smaller of the number of remaining charge cycles before a discharge capacity lower limit is reached or the number of remaining charge cycles before a discharge time lower limit is reached. Rsol is used to estimate the number of remaining charge cycles before a discharge capacity lower limit is reached. Rct is used to estimate the number of remaining charge cycles before a discharge time lower limit is reached.

BRIEF DESCRIPTION OF THE DRAWINGS

FIG. 6 shows an example of the information stored in the nonvolatile memory;

FIG. 12 shows a score table for determining scores;

FIG. 13 shows a coefficient table that shows the coefficients according to the purposes of use of batteries.

DETAILED DESCRIPTION OF THE EMBODIMENTS

Figure 1:
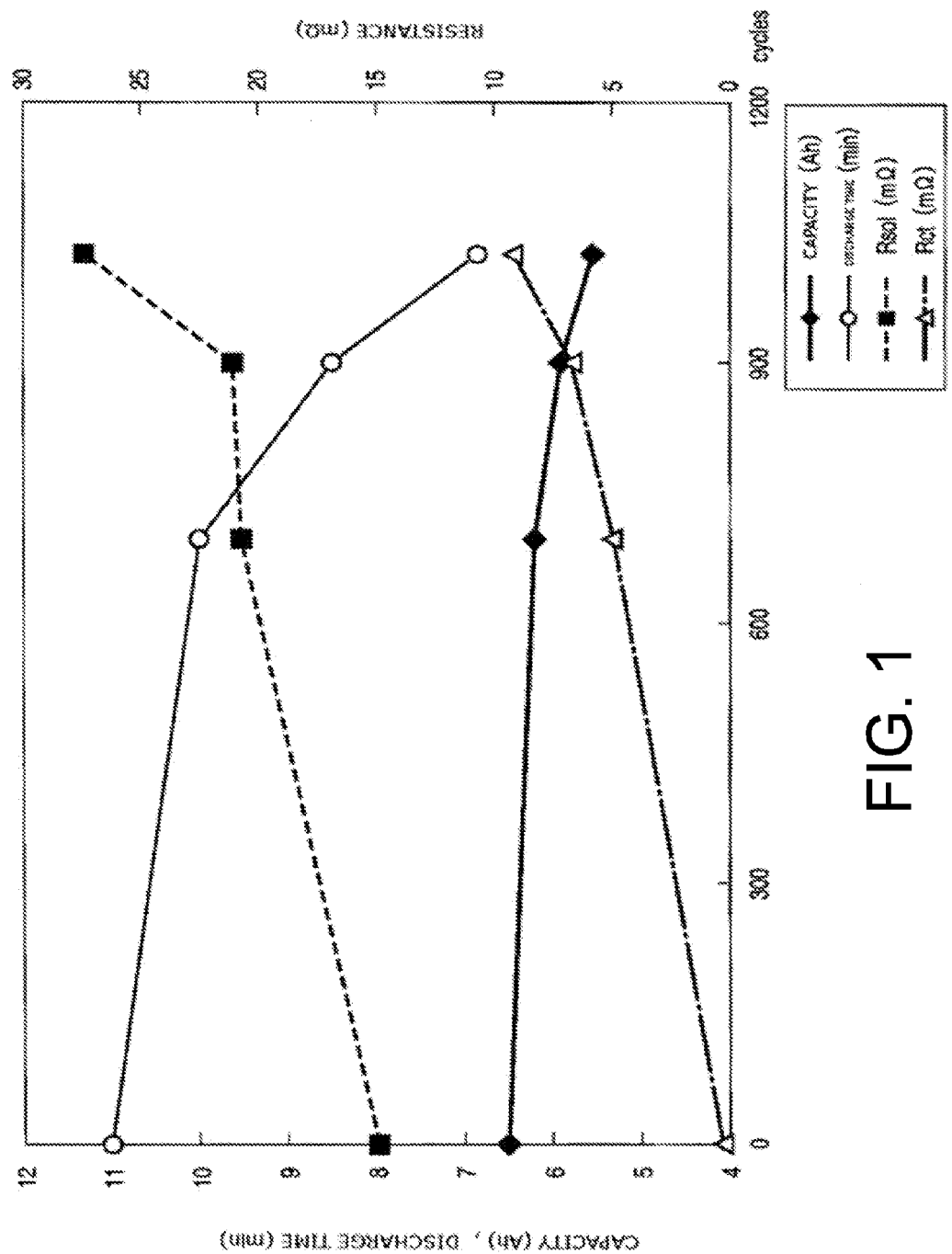
FIG. 1 is a graph showing the respective transitions of indicators related to the performance of a secondary battery.

According to an embodiment, a diagnosis device includes: a resistance component determining unit that determines the solution resistance $R_{SOL}$ and the charge transfer resistance $R_{CT}$ of a battery; and an indicator calculating unit that refers to deterioration transition information about $R_{SOL}$ and $R_{CT}$ each having the number of used cycles as a parameter, estimates the present number of used cycles of one resistance component of the determined $R_{SOL}$ and $R_{CT}$, whichever has the larger deterioration, and sets an indicator indicating the present value of the battery with the use of the estimated present number of used cycles, the indicator being the smaller one of the number of remaining cycles required for the discharged capacity to reach its lower limit and the number of remaining cycles required for the discharge time to reach the lower limit.

According to another embodiment, a battery pack that is capable of connecting to the above diagnosis device includes: a battery module that has at least a plurality of cells connected in series; a voltage and temperature measuring unit that measures voltages and temperatures of the cells; a communication terminal that connects communication lines for exchanging information with the diagnosis device; a first terminal that connects lines extending from both ends of the at least one cell; and a second terminal that connects lines extending from both ends of the battery module, line conduction holes for connecting to both ends of the one cell being formed in the exterior of the battery module.

According to yet another embodiment, a method of creating a battery value indicator includes: accumulating history information by connecting a diagnosis device to a battery and acquiring the battery capacities at respective C rates and $R_{SOL}$ and $R_{CT}$, wherein C rate is a current value in which the battery nominal capacity can be discharged in one hour; acquiring the history information containing the battery capacities at the respective C rates representing the characteristics of the battery and $R_{SOL}$ and $R_{CT}$, comparing the history information with reference deterioration data to select deterioration data most similar to the reference deterioration data, and turning the present deterioration state of the battery into numerical values with respect to the respective characteristics, based on the selected deterioration data; and weighting the numerical values with coefficients according to the purpose of future use, and adding up the new numerical values to create the indicator of the present value of the battery.

Normally, the internal resistance of a battery often means the DC resistance component existing inside the battery. However, when a DC voltage continues to be applied to a battery, ions concentrate on electrodes with time, and current ceases to flow smoothly. This phenomenon implies that there exists not only the ohmic resistance but also an impedance component that causes a phase difference between the current and the voltage.

In a battery, there normally exist a solution resistance $R_{SOL}$ that is a DC resistance component and results from an electrolytic solution, and a charge transfer resistance $R_{CT}$ that is an AC resistance component. A first embodiment of the present disclosure provides a method of determining the present value of a secondary battery by taking into consideration both of the resistance components $R_{CT}$ and $R_{SOL}$.

FIG. 1 is a diagram showing the respective transitions of indicators related to the performance of a secondary battery. The abscissa axis in FIG. 1 indicates the number of used cycles of the secondary battery. The left-side ordinate axis indicates the continuous discharge time (min) and the discharged capacity (Ah), and the right-side ordinate axis indicates $R_{CT}$ (mΩ) and $R_{SOL}$ (mΩ).

As shown in FIG. 1, $R_{SOL}$ linearly increases until 900 cycles, but, after that, rapidly increases almost in a discontinuous manner. When this rapid increase in resistance is sensed, an acceleration in deterioration of the battery can be detected. On the other hand, as can be seen from the transition curves of the continuous discharge time and the discharged capacity shown as the indicators of the performance of the secondary battery, performance deterioration is detected around 700 cycles prior to the change of $R_{SOL}$. However, the transition curve of $R_{SOL}$ does not show a transition to an increasing tendency around 700 cycles. Therefore, it becomes apparent that deterioration cannot be detected only by measuring $R_{SOL}$.

On the other hand, $R_{CT}$ already indicates an increasing tendency around 700 cycles, and this tendency becomes more remarkable around 900 cycles.

Normally, film is deposited on the surfaces of electrodes due to use of a secondary battery, and $R_{CT}$ increases accordingly. In a case where film is deposited on the surfaces of electrodes, $R_{CT}$ increases linearly. When the crystalline structures of the electrodes collapse or an electrode miniaturization phenomenon called "bulk cracking" is caused in a secondary battery, film is also deposited in the gaps in the miniaturized structure. Since the surface areas of the electrodes become larger as the electrodes are miniaturized, $R_{CT}$ increases at an accelerated rate. The $R_{CT}$ curve in FIG. 1 exactly shows this feature.

Phenomena such as the crystalline structure collapse and the bulk cracking do not affect the DC resistance component $R_{SOL}$ at first. After a while, however, the growth of the film formed on the electrodes is accelerated, and the battery performance tends to deteriorate rapidly.

The transition curve of $R_{SOL}$ indicates this aspect, as $R_{SOL}$ does not show a change in its increasing tendency around 700 cycles but rapidly increases after 900 cycles.

In view of the above, battery deterioration cannot be accurately predicted only by measuring $R_{SOL}$, and it is necessary to measure $R_{CT}$ as well.

Next, a method of measuring $R_{SOL}$ and $R_{CT}$ is described.

Figure 2:
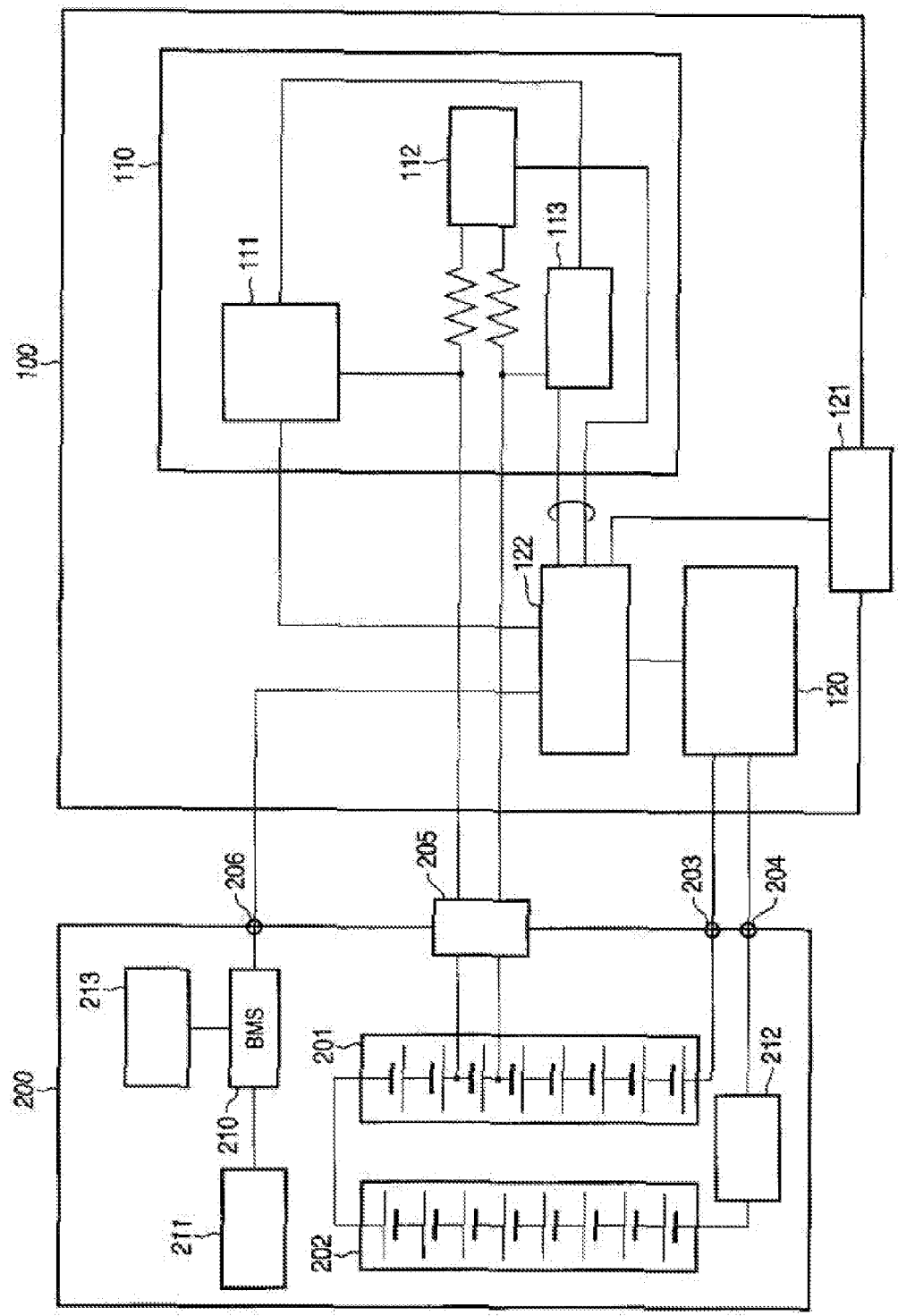
FIG. 2 is a diagram showing a connection between a diagnosis device and a battery pack.

FIG. 2 is a diagram showing a connection between a diagnosis device 100 and a battery pack 200 according to the first embodiment. The battery pack 200 is normally mounted in an electric vehicle or the like, and supplies power. The diagnosis device 100 is connected to the battery pack 200, and measures $R_{SOL}$ and $R_{CT}$.

In the battery back 200, battery modules 201 and 202 are connected in series, to form an assembled battery. In FIG. 2, the number of battery modules connected in series is two, but may be an arbitrary number of two or larger. Each of the battery modules includes eight cells, but may include two or more cells or an arbitrary number of cells. Furthermore, the cells may not be connected in series, and may be connected in parallel instead.

The positive electrode of the assembled battery is connected to a connecting terminal 203, and the negative electrode is connected to a connecting terminal 204 via a current detector 212.

Holes are formed in the exterior of each of the battery modules, and the wires from the positive electrode and the negative electrode of one cell are connected to a terminal 205.

The signal lines from the diagnosis device 100 for measuring $R_{SOL}$ and $R_{CT}$ are connected to the terminal 205.

The terminals of the cells of the battery modules 201 and 202 are also connected to a voltage and temperature measuring unit 211. The voltage and temperature measuring unit 211 periodically measures the voltages and temperatures of the cells included in the battery modules 201 and 202, for the purpose of monitoring.

The measurement information from the voltage and temperature measuring unit 211 is input to a BMS (Battery Management System) 210. The BMS 210 also receives current values detected by the current detector 212 via a signal line (not shown). The BMS 210 collects the above-described voltages, temperatures, and current values, and calculates an indicator such as the state of charge (SOC), based on the collected values.

The BMS 210 further communicates with external devices (such as an automobile engine control device ECU and the diagnosis device 100) via a communication terminal 206, to exchange various kinds of information. The BMS 210 also stores collected information, calculated information, exchanged information into a nonvolatile memory 213.

The diagnosis device 100 includes an AC impedance technique measuring unit 110, a charge-discharge unit 120, a start switch 121, and a controller 122.

The AC impedance technique measuring unit 110 includes an AC oscillator 111, a voltage measuring unit 112, and a current measuring unit 113. The AC impedance technique measuring unit 110 supplies AC voltages swept at frequencies from the AC oscillator 111 to the battery via the terminal 205. The AC impedance technique measuring unit 110 measures voltages and currents with the voltage measuring unit 112 and the current measuring unit 113.

The charge-discharge unit 120 is capable of performing rapid charging and discharging. The positive electrode of the charge-discharge unit 120 is connected to the connecting terminal 203 of the battery pack 200, and the negative electrode of the charge-discharge unit 120 is connected to the connecting terminal 204 of the battery pack 200.

The controller 122 controls the operation of the charge-discharge unit 120, and measures $R_{SOL}$ and $R_{CT}$, based on measurement signals transmitted from the AC impedance technique measuring unit 110. The start switch 121 instructs the controller 122 about the timing to start a measuring operation.

The controller 122 is connected to the charge-discharge unit 120, and to the AC oscillator 111, the voltage measuring unit 112, and the current measuring unit 113 in the AC impedance technique measuring unit 110, by communication lines. The controller 122 is further connected to the BMS 210 of the battery pack 200 by a communication line.

Next, the operations to be performed by the diagnosis device 100 to measure $R_{SOL}$ and $R_{CT}$ are described.

To make a periodic diagnosis of an electric vehicle, the measurer disconnects the battery pack 200 from the electric vehicle, and connects the battery pack 200 to the diagnosis device 100. After connecting the battery pack 200 and the diagnosis device 100 as shown in FIG. 2, the measurer starts to carry out measurement.

Figure 3:
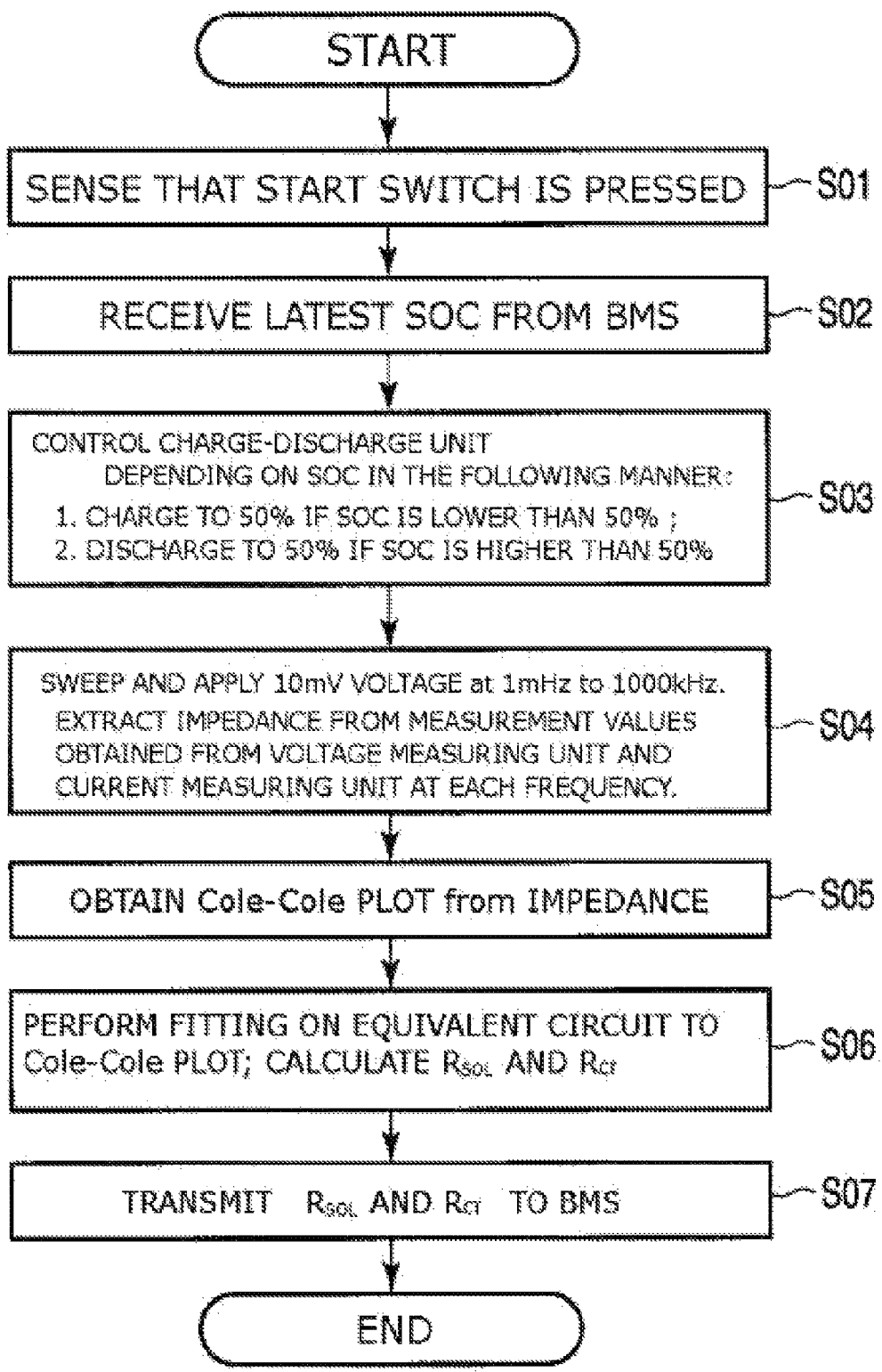
FIG. 3 is a flowchart showing the measuring operations to be performed by the controller in the diagnosis device.

FIG. 3 is a flowchart showing the gist of a measuring operation to be performed by the controller 122 of the diagnosis device 100.

In step S01, the controller 122 senses that the battery pack 200 is connected to the diagnosis device 100 and the start switch 121 is pressed. In step S02, the controller 122 communicates with the BMS 210, and receives the current SOC of the battery.

In step S03, the controller 122 exchanges information with the BMS 210 through communications, and performs an operation to set the current SOC of the battery at 50%. Specifically, if the SOC is 50% or higher, the controller 122 controls the rapid charge-discharge unit to perform discharging. If the SOC is lower than 50%, the controller 122 controls the rapid charge-discharge unit to perform charging.

Here, the SOC is set at 50%, so as to prevent the battery from being overcharged or over-discharged in the charging or discharging during the AC impedance measurement to be carried out later. Since the SOC calculated by the BMS 210 is the SOC of the entire battery pack 200, it is not possible to determine whether the SOC of the cell to be subjected to the AC impedance measurement is 50%, based on the result of the procedure of step S03. However, the operation to set the SOC at 50% is performed to prevent an overcharged state as described above, and therefore, the SOC of the cell may not be exactly 50%.

In step S04, the AC impedance technique measuring unit 110 sweeps an AC voltage having a voltage amplitude of ±10 mV in 10-fold increments in the range of 1 mHz to 100 kHz in frequency (1 mHz, 10 mHz, 100 mHz, . . . , 1000 kHz), and applies the AC voltage to the cell. In conjunction with this operation, the current measuring unit 113 and the voltage measuring unit 112 measure the current and the voltage in the cell, respectively.

The controller 122 then acquires the waveforms representing the change of current and the change of voltage at each frequency from the current measuring unit 113 and the voltage measuring unit 112. The controller 122 then extracts the real part and the imaginary part from the complex representation of the impedance obtained from the current-voltage ratio.

In step S05, the controller 122 normally expresses the measurement data about each frequency by using an expression method called the Cole-Cole plot or the complex plane plot.

Figure 4:
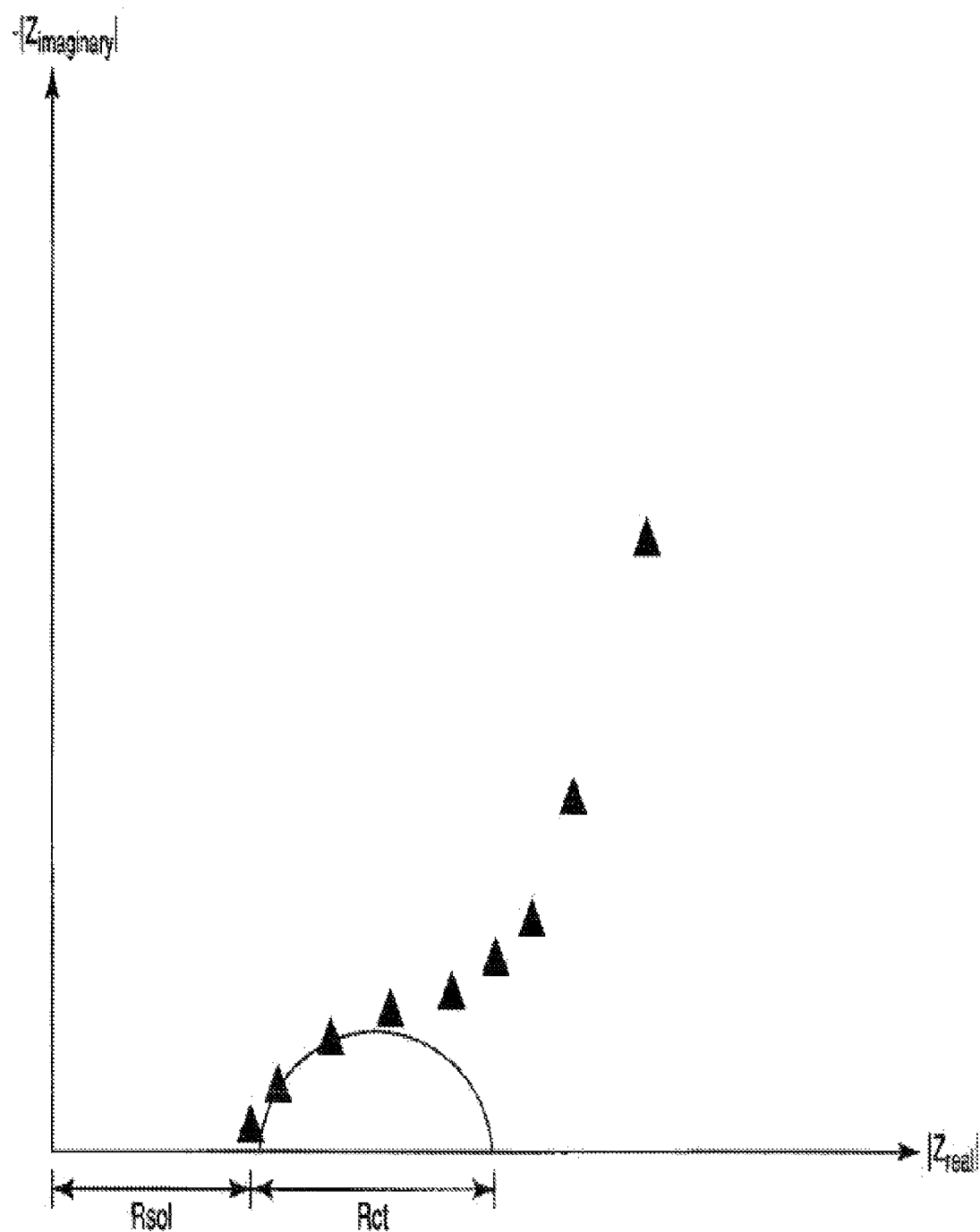
FIG. 4 is a graph showing measurement results in Cole-Cole plot.

FIG. 4 is a graph showing measurement results expressed by the Cole-Cole plot. In FIG. 4, the ordinate axis indicates the imaginary part of the impedance, and the abscissa axis indicates the real part of the impedance. The measurement points are plotted with triangular marks at the respective frequencies at which sweeping is performed.

In step S06, the controller 122 determines the respective parameters of an equivalent circuit of the battery by performing fitting, so that the parameters match the obtained measurement values.

Figure 5:
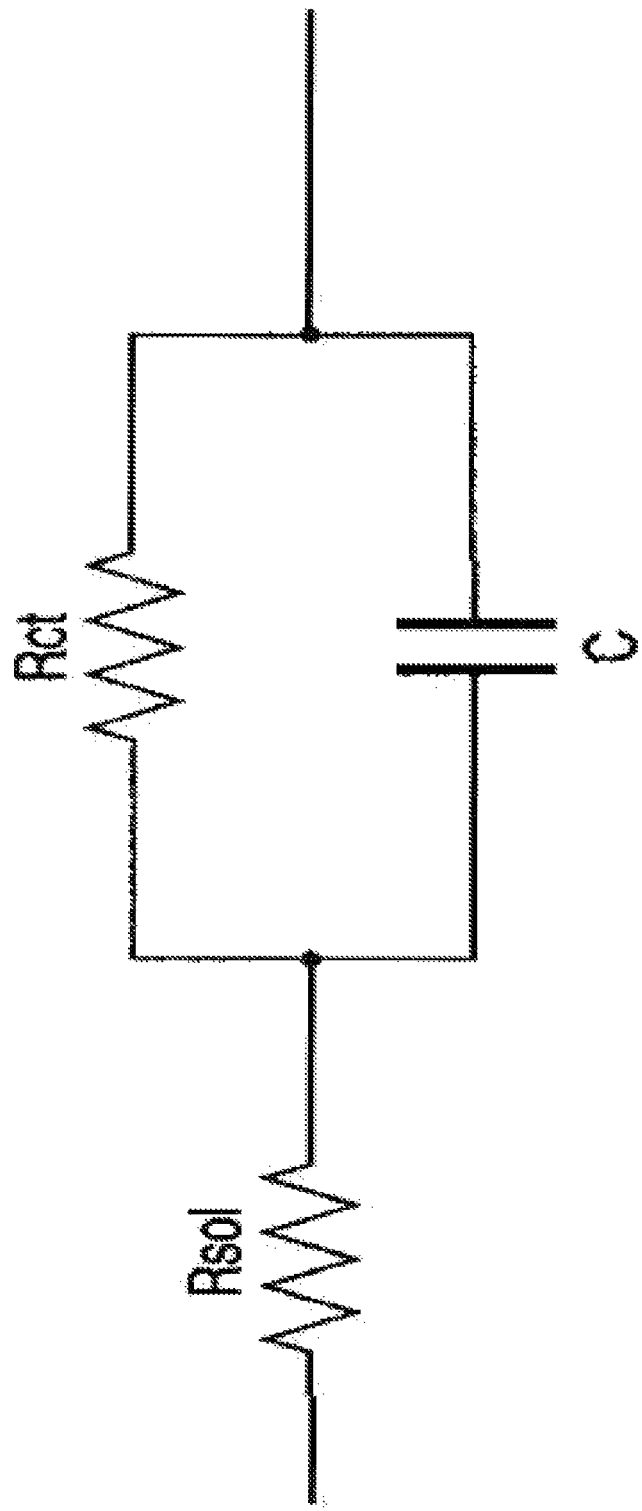
FIG. 5 is a diagram of an equivalent circuit of a battery to be used in fitting.

FIG. 5 is a diagram showing the equivalent circuit of the battery that is used in the fitting. According to this equivalent circuit, the impedance of C can be ignored at the high-frequency region, and the equivalent circuit is equivalent to a circuit involving only $R_{SOL}$. Therefore, the imaginary part of the circuit impedance becomes zero. Accordingly, the distance from the point of origin in the Cole-Cole plot to the point where the plotting is performed on the real part axis for the first time is equivalent to $R_{SOL}$. In the low-frequency region, the impedance of C is regarded as infinite, and the diameter of the semicircular curve representing the fitting result is equivalent to $R_{CT}$.

The above described equivalent circuit is a model expressing the impedance of a battery, and there are other variations of equivalent circuits. This embodiment maintains that $R_{SOL}$ and $R_{CT}$ are determined by performing fitting to an equivalent circuit expressing the impedance.

Other than the above described method, the following method of performing fitting to an equivalent circuit may be used. The AC oscillator 111 applies an AC current having the sine wave of each frequency superimposed thereon in advance. The controller 122 determines the impedance components corresponding to the respective frequencies by performing Fourier transformations on the obtained voltage and current waveforms.

In step S07, the controller 122 transmits the obtained $R_{SOL}$ and $R_{CT}$ to the BMS 210 via a communication line.

The BMS 210 encrypts the information about the temperatures and voltages of the respective components of the battery pack measured by the voltage and temperature measuring unit 211, as well as the transmitted $R_{SOL}$ and $R_{CT}$. After that, the BMS 210 stores the information into the nonvolatile memory 213. FIG. 6 is a diagram showing an example of the information stored in the nonvolatile memory 213.

Although one specific cell in the battery pack is subjected to measurement in the above described embodiment, measurement may be carried out on more than one cell. Also, the cell to be subjected to measurement is not limited to one that is located in the center portion of a battery module, but may be one that is located on an end portion where the temperature condition is poor. The above described measurement can be carried out on all the cells in the battery pack, but such an operation leads to an increase of the cost of the diagnosis device 100. The number of cells to be subjected to measurement may be determined by taking into consideration the relationship with the cost increase.

Next, a method of determining the present value of the battery is described.

The present value of the battery is determined by calculating the number of remaining usable cycles, based on the obtained $R_{SOL}$ and $R_{CT}$ and deterioration tendency data obtained through a battery evaluation.

Figure 7:
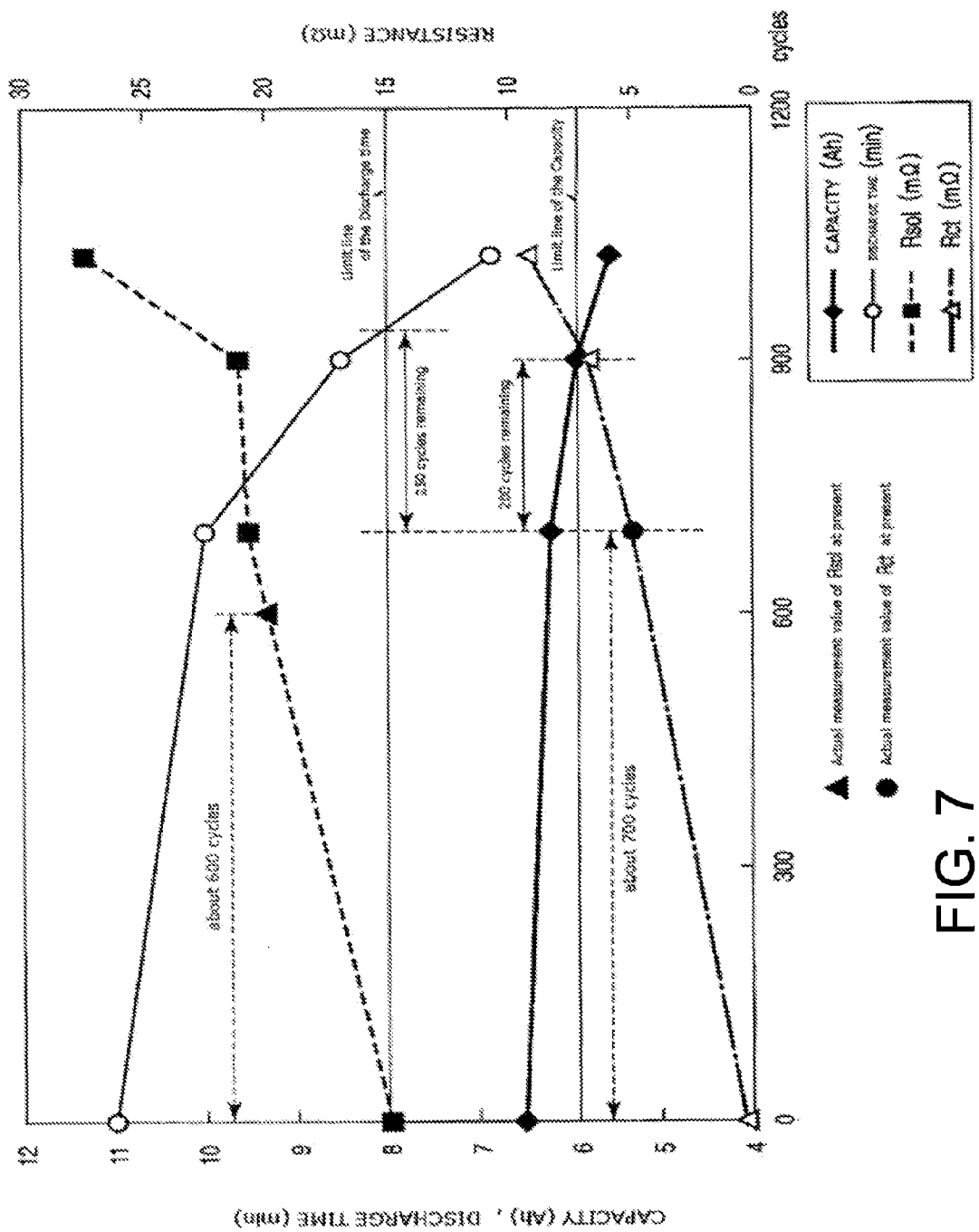
FIG. 7 illustrates a method of calculating the numbers of cycles that can be used.

FIG. 7 is a graph illustrating a method of calculating the number of usable cycles. In FIG. 7, the transition of the data about the deterioration tendency of standard battery performance under certain conditions of use is shown with the number of used cycles as the common parameter. The coordinates of the graph of FIG. 7 are the same as the coordinates of the graph of FIG. 1, and therefore, a detailed explanation of them is not provided herein.

As a result of measurement of resistance values at a certain point, $R_{SOL}$ was 20 mΩ and $R_{CT}$ was 5 mΩ. The respective measurement points are plotted on the $R_{SOL}$ and $R_{CT}$ curves in FIG. 7. In FIG. 7, the measurement points are indicated by triangular marks and circular marks.

While the $R_{SOL}$ curve shows that about 600 cycles have been used, the $R_{CT}$ curve shows that about 700 cycles have been used. As can be seen from these curves, $R_{CT}$ has deteriorated more than $R_{SOL}$ has. Accordingly, $R_{CT}$ is used as the indicator for determinations in the procedures thereafter.

However, in a case where the lower limit performance of a battery to be used in an electric vehicle shows a discharged capacity of 6 Ah or higher and a discharge time of 8 minutes, the number of cycles required to reach the respective lower limit values is calculated from the current number of cycles (700 cycles) determined from $R_{CT}$.

When the discharge time reaches the lower limit, the number of cycles is 950, and therefore, the number of remaining cycles is 250. When the discharged capacity reaches the lower limit, the number of cycles is 900, and therefore, the number of remaining cycles is 200.

Since the number of remaining cycles required for the discharged capacity to reach the lower limit can be predicted to be smaller than the number of remaining cycles required for the discharge time to reach the lower limit, the present value of the battery is determined to be the remaining 200 cycles that can be used in this example.

The relationships between the discharged capacity and discharge time, and $R_{SOL}$ and $R_{CT}$ vary with the types of batteries. Therefore, the respective reference curves shown in FIG. 7 are formed in accordance with the type of the battery and the like.

A second embodiment differs from the first embodiment in that the present value of a battery is determined with the use of a measured current capacity as well as the measured $R_{SOL}$ and $R_{CT}$. Therefore, the same components as those of the first embodiment are denoted by the same reference numerals as those used in the first embodiment, and a detailed explanation of them is not provided herein.

In the second embodiment, in a periodic diagnosis of an electric vehicle or the like, $R_{SOL}$ and $R_{CT}$ are measured while the battery pack 200 is connected to the diagnosis device 100, as in the first embodiment.

Next, the capacities of a battery at different C rates are measured.

The charge-discharge unit 120 of the diagnosis 100 has the functions to perform step-down discharging and step-down charging, and is capable of measuring the battery capacities at the respective C rates: 1 C, 2 C, 4 C, and 8 C.

Figure 8:
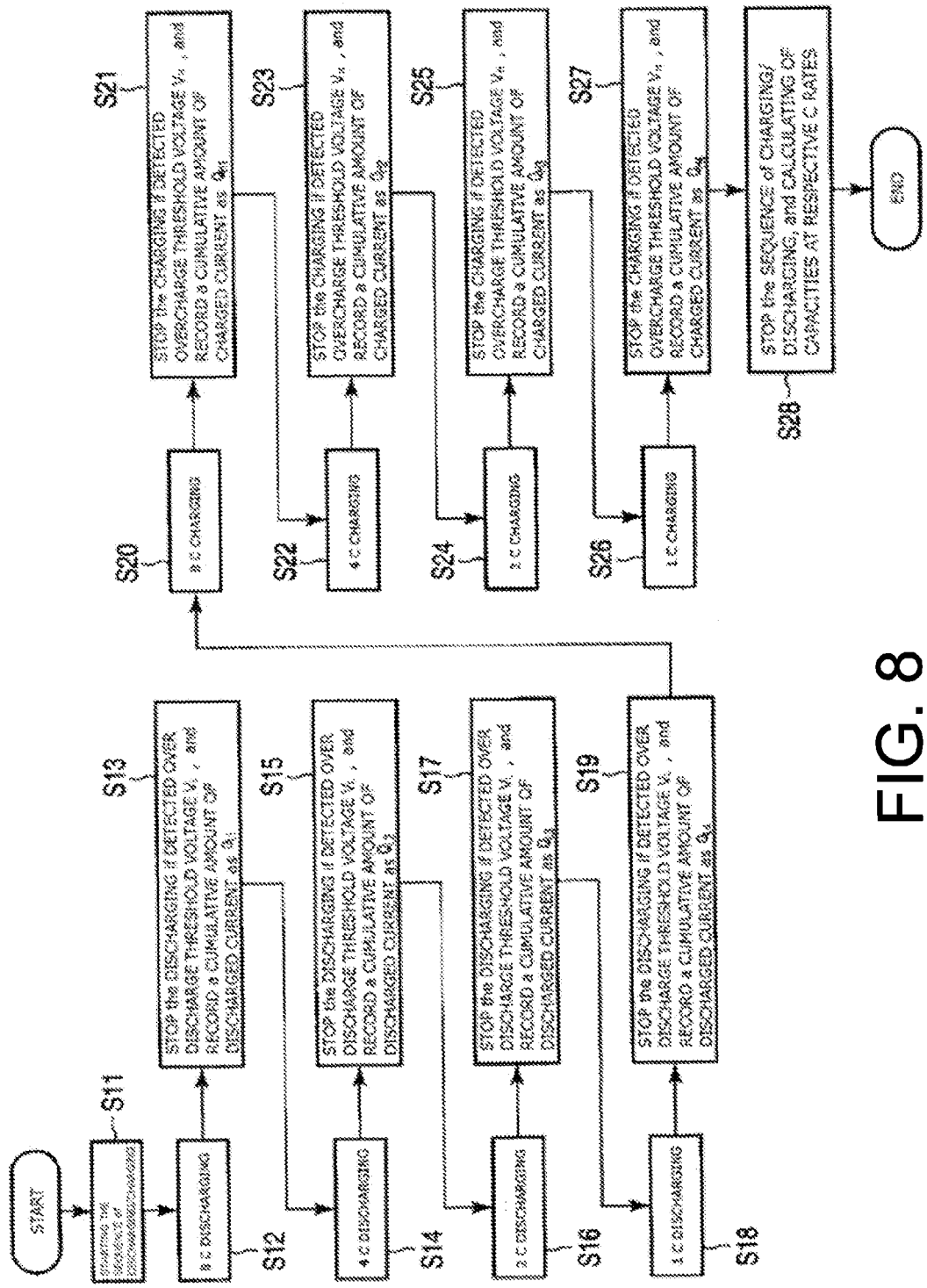
FIG. 8 is a flowchart showing the operations to determine the capacities at the respective C rates by performing charging and discharging.

FIG. 8 is a flowchart showing the gist of an operation to determine the capacities at the respective C rates by performing charging or discharging.

In step S11, the controller 122 is switched to a mode for controlling charging and discharging. When the start switch 121 is switched on, in step S12, the controller 122 first controls the charge-discharge unit 120 to perform 8 C discharging. Here, a "1 C" means the current observed when the nominal capacity is discharged in one hour. Accordingly, an "8 C" indicates that discharging is performed with a current eight times larger than the 1 C current.

In step S13, when sensing that the total voltage of the battery pack 200 has reached a threshold voltage $V_L$ set for detecting over discharge through a communication with the BMS 210, the controller 122 stops the discharging. The controller 122 then obtains the discharged cumulative current amount $Q_{L1}$ at this point through a communication with the BMS 210, and records the cumulative current amount $Q_{L1}$.

In step S14, the controller 122 controls the charge-discharge unit 120 to start 4 C discharging. As the 4 C discharge current that is smaller than 8 C discharge current is used, the voltage decrease due to internal resistance becomes smaller. Accordingly, the total voltage of the battery pack 200 becomes higher than the threshold voltage $V_L$, and further discharging can be performed. In step S15, sensing that the total voltage has reached the threshold voltage $V_L$ as in the case of the 8 C discharging, the controller 122 stops the discharging, and records the cumulative current amount $Q_{L2}$ discharged during that time.

In step S16, the controller 122 controls the charge-discharge unit 120 to start 2 C discharging. In step S17 through step S19, the same procedures as above are carried out until 1 C discharging is performed, and the cumulative current amounts $Q_{L3}$ and $Q_{L4}$ are obtained.

In step S20, the controller 122 controls the charge-discharge unit 120 to perform 8 C charging. In step S21, sensing that the total voltage of the battery pack 200 has reached a threshold voltage $V_H$ for detecting overcharge, the controller 122 controls the charge-discharge unit 120 to stop the charging, and records the cumulative current amount $Q_{H1}$ discharged during that time.

In step S22, the controller 122 controls the charge-discharge unit 120 to perform 4 C charging. In step S23 through step S27, the same procedures as above are carried out until 1 C charging is performed, and the cumulative current amounts $Q_{H2}$, $Q_{H3}$, and $Q_{H4}$ are obtained. The charging and discharging are then stopped. In step S28, the controller 122 calculates the capacities at the respective C rates.

Figure 9:
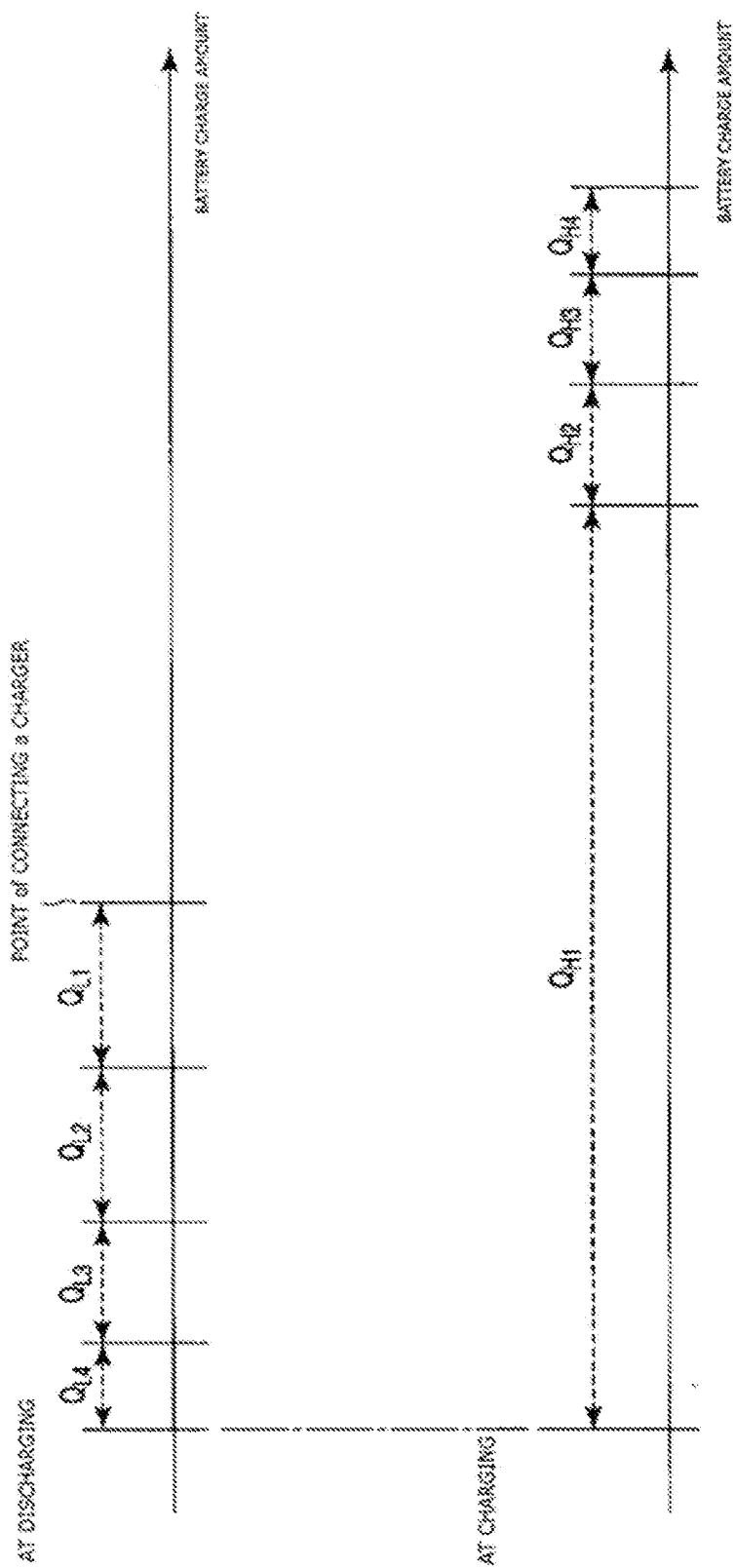
FIG. 9 is a graph showing the relationships among the cumulative current amounts obtained by performing charging and discharging.

FIG. 9 is a diagram showing the relationships among the cumulative current amounts $Q_{L1}$ through $Q_{L4}$ and $Q_{H1}$ through $Q_{H4}$ obtained through charging and discharging. The controller 122 calculates the capacities at the respective C rates, according to the equations shown in the lower part of FIG. 9.

After that, the controller 122 notifies the BMS 210 of the respective battery pack capacities at 1 C, 2 C, 4 C, and 8 C. After encryption, the BMS 210 records the temperatures for the charging and discharging, and the capacities at the respective C rates into the nonvolatile memory 213. The contents recorded here are the information shown in FIG. 6 as well as the capacities at the respective C rates.

Next, a method of determining the present value of the battery pack 200 is described.

The controller 122 communicates with the BMS 210, to acquire the history information about the past $R_{SOL}$ and $R_{CT}$, and the battery capacities at the respective C rates. The controller 122 then extracts the information corresponding to the measurement temperatures of 15 to 25° C. from the acquired history information. The measurement temperatures are used for the extraction, because the performance of the battery is affected by temperatures. The temperature range may be determined by the characteristics of the battery and the region where the automobile having the battery mounted therein is used.

The acquired history information is then plotted as Cartesian coordinates, with the abscissa axis being the time axis. The plotted history information is compared with reference information. The reference information is the data that indicates the deterioration tendency of the battery measured under various conditions to evaluate the battery pack. Information as to different temperature conditions is prepared, and the information as to the temperature condition most similar to a designated temperature condition is selected as the reference information. The reference information includes more than one pattern for a single temperature condition.

Figure 10:
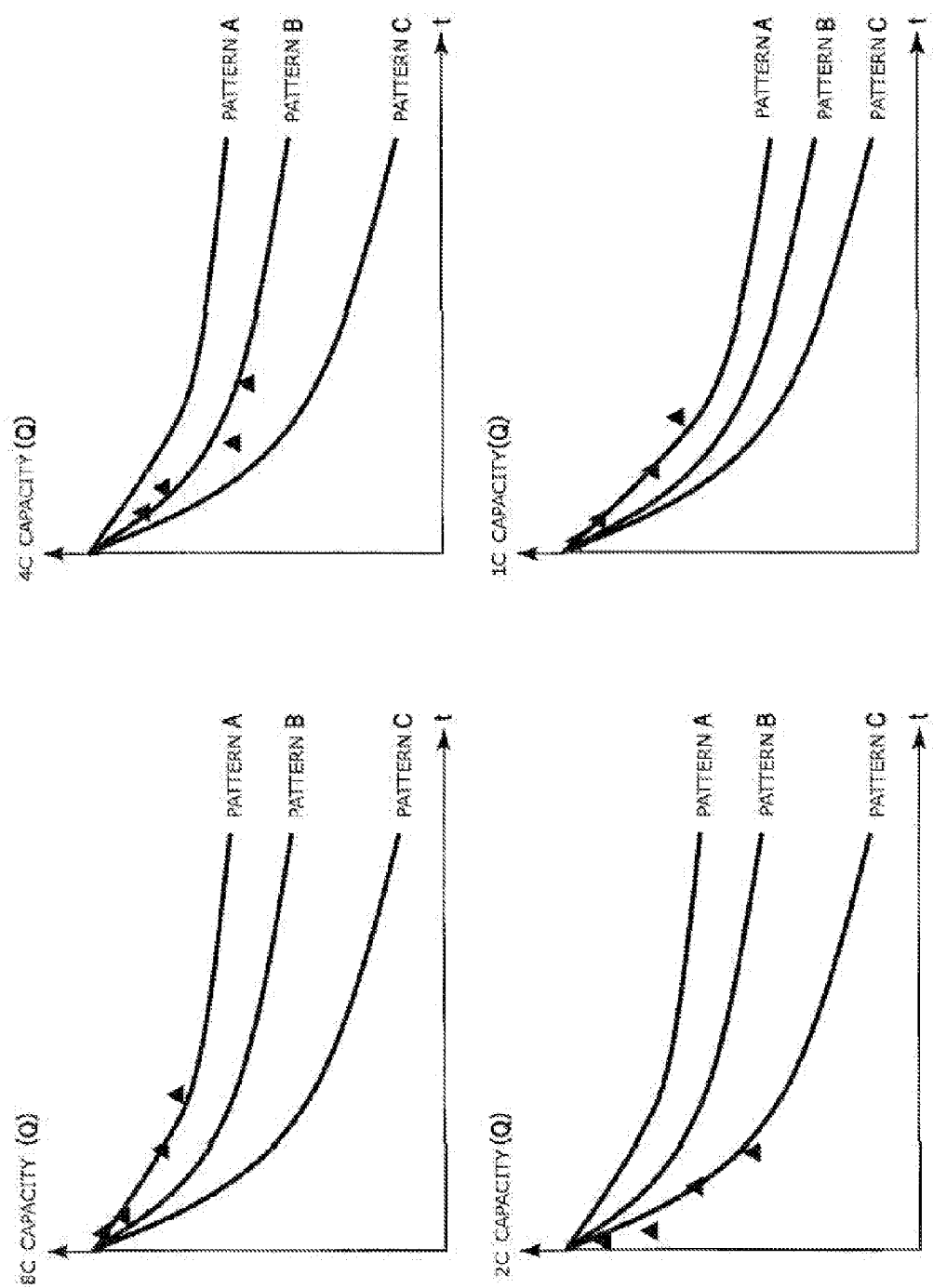
FIG. 10 shows examples of the reference information with respect to the capacities at the respective C rates.
Figure 11:
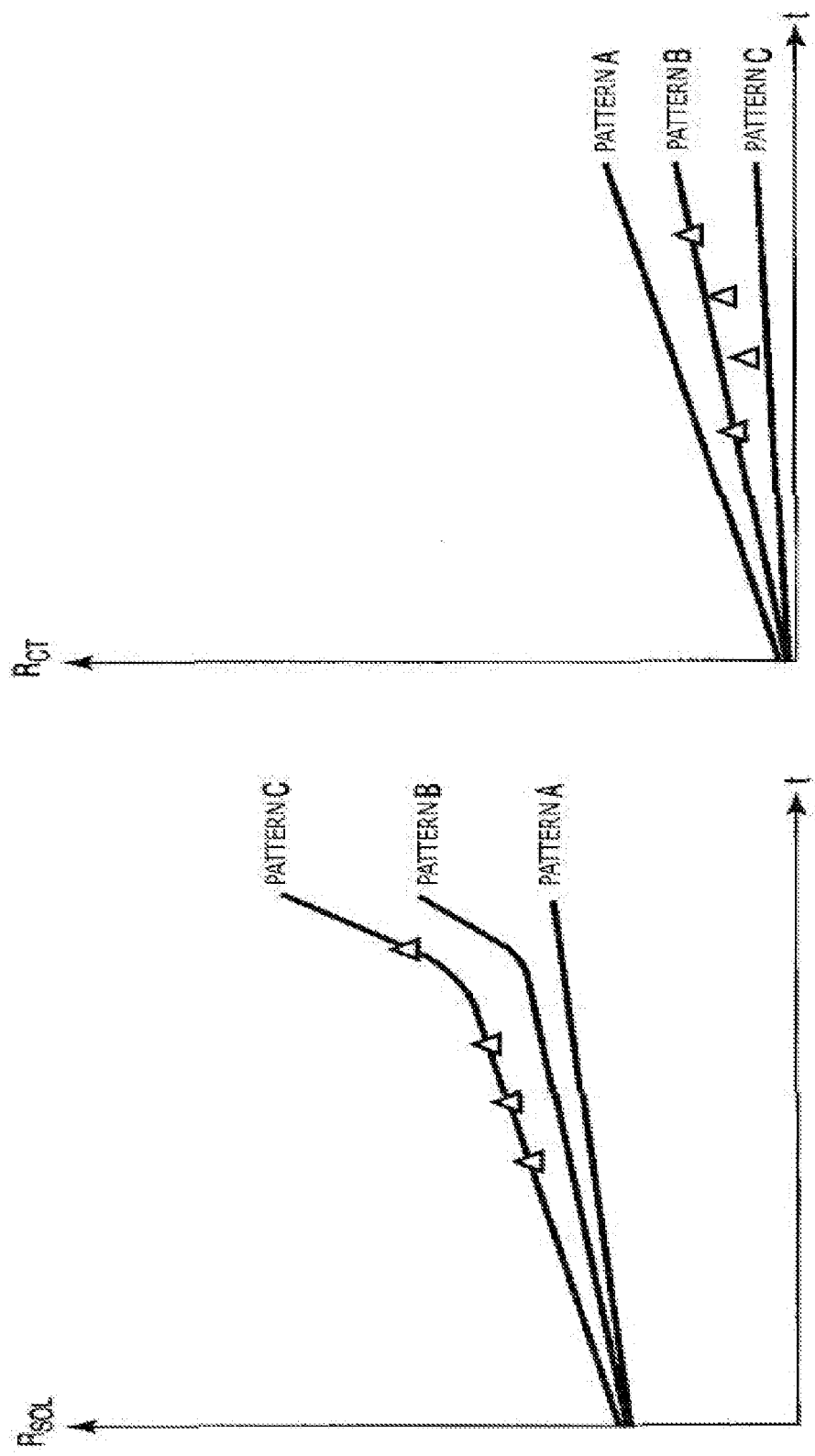
FIG. 11 shows examples of the reference information with respect to $R_{SOL}$ and $R_{CT}$.

FIG. 10 is graphs showing examples of the reference information with respect to the capacities at the respective C rates. FIG. 11 is graphs showing examples of the reference information with respect to $R_{SOL}$ and $R_{CT}$.

The upper-left coordinates in FIG. 10 are described as an example. The history information about the battery capacity at the rate of 8 C obtained through measurement is plotted. This history information is indicated by triangular marks. The pattern most similar to the history information is selected from the respective patterns (patterns A through C) shown as reference information. In this example, the pattern A is selected.

Patterns are selected from the other indicators in the same manner as above. As a result, the pattern B is selected for the battery capacity at the rate of 4 C, as shown in FIG. 10. The pattern C is selected for the battery capacity at the rate of 2 C. The pattern A is selected for the battery capacity at the rate of 1 C. As shown in FIG. 11, the pattern C is selected for $R_{SOL}$. The pattern B is selected for $R_{CT}$.

Next, a score is determined for each indicator.

FIG. 12 shows score tables for determining scores. The age of service of the battery is two years.

As for the battery capacity at the rate of 8 C, the pattern A is selected, and accordingly, the score is 9. As for the battery capacity at the rate of 4 C, the pattern B is selected, and accordingly, the score is 7. As for the battery capacity at the rate of 2 C, the pattern C is selected, and accordingly, the score is 6. As for the battery capacity at the rate of 1 C, the pattern A is selected, and accordingly, the score is 9. As for $R_{SOL}$, the pattern C is selected, and accordingly, the score is 5. As for $R_{CT}$, the pattern B is selected, and accordingly, the score is 7.

In the above mentioned score tables, the higher the score, the higher the value. However, the value of the battery cannot be correctly evaluated simply by adding up the scores, because the scores determined here are the scores based on the past history. The value of the battery should be determined in terms of future use.

Therefore, each indicator is weighted in accordance with the type of future use or the purpose of use.

FIG. 13 shows a coefficient table that shows coefficients suitable for respective purposes of use of a battery. The values obtained by multiplying the above indicators by the coefficients obtained from this coefficient table are the present values of the battery pack.

For example, the value of a battery to be used for a vehicle in the future is 26.6 (=9×1+7×0.5+6×0.2+9×0.1+5×1.0+7×1.0). The value of a battery to be used for a motorcycle in the future is 19.7 (=9×0.4+7×0.5+6×0.3+9×0.3+5×0.5+7×0.8).

As described above, the history information is acquired for the respective characteristics of the battery, and, based on the history information, the deterioration state is turned into numerical values with respect to the respective characteristics. The obtained numerical values are weighted with the coefficients according to the future use, and new numerical values are obtained. The numerical values are added up, and the resultant value is used as the evaluation value for the battery. In this manner, the present value of the battery can be reasonably determined.

Also, $R_{SOL}$ and $R_{CT}$ are used as the characteristics of the battery to be used, so that the deterioration state of the battery can be determined with high precision.

Third Embodiment

In the second embodiment, the charging and discharging operations by the charge-discharge unit 120 are controlled to measure the battery capacities with the respective currents of 1 C, 2 C, 4 C, and 8 C. The third embodiment differs from the second embodiment in that the indicators are measured only through charging operations. Therefore, the same components as those of the first embodiment are denoted by the same reference numerals as those used in the first embodiment, and a detailed explanation of them is not provided herein.

Figure 14:
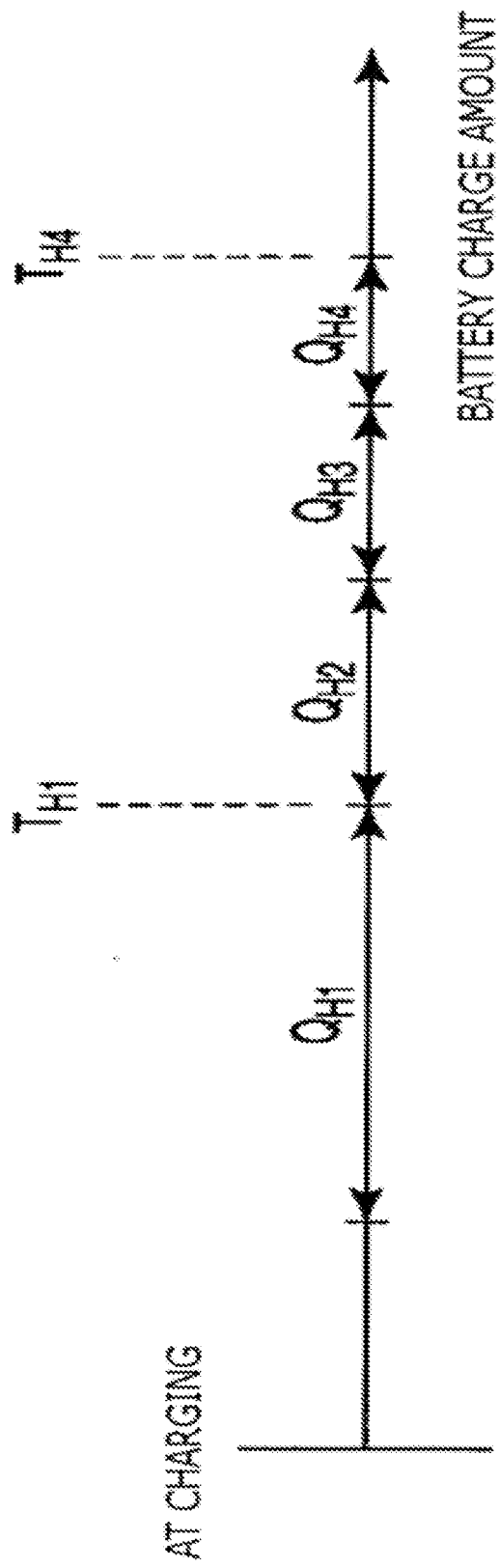
FIG. 14 shows the relationship between time $T_{H4}$ and time $T_{H1}$ obtained by performing charging.

FIG. 14 shows the relationship between time $T_{H4}$ and time $T_{H1}$ obtained through charging. Referring to FIG. 14, the operations of the controller 122 are described.

The diagnosis device 100 is connected to the battery pack 200, the controller 122 is switched to the mode for controlling charging, and the start switch 121 is switched on. The controller 122 then controls the charge-discharge unit 120 to perform 8 C charging. When sensing that the total voltage of the battery pack 200 has reached the threshold voltage $V_H$ for detecting overcharge through a communication with the BMS 210, the controller 122 controls the charge-discharge unit 120 to stop the charging. The controller 122 then records the time $T_{H1}$ at that point, and performs 4 C charging.

In the 4 C charging, when sensing that the total voltage of the battery pack 200 has reached the threshold voltage $V_H$ for detecting overcharge, the controller 122 stops the charging. The controller 122 then performs 2 C charging and 1 C charging in the same manner as above, and records the time $T_{H4}$ when the 1 C charging is finished.

After that, the controller 122 notifies the BMS 210 in the battery pack 200 of the obtained time information ($T_{H4}$-$T_{H1}$). The BMS 210 encrypts the temperatures for the charging and the time information ($T_{H4}$-$T_{H1}$), and then records the encrypted information into the nonvolatile memory 213.

As the battery deteriorates and the internal resistance of the battery becomes higher, the above described time ($T_{H4}$-$T_{H1}$) is considered to also become longer. Accordingly, the above described time can replace the deterioration tendency indicator of a battery capacity when a large amount of current flows.

By the evaluation method utilizing the diagnosis device 100 described in the first embodiment of the present disclosure, the present value of a battery to be used in the future can be determined with high precision. By the determination method utilizing the diagnosis device 100 typically embodied by the second embodiment, a value calculation can be performed in accordance with the purpose of future use. By the diagnosis method described in the third embodiment, the time from the end of high-rate charging in step-down charging to the end of low-rate charging is used as a substitute indicator of a battery capacity at a high rate. By this method, the charge-discharge unit 120 does not need to have a discharging function. Accordingly, the design of the diagnosis device 100 can be simplified, and the costs can be lowered. Also, the BMS 210 encrypts measured data and stores the encrypted data into a data storage such as a nonvolatile memory. Accordingly, falsification of data can be prevented, and an accurate and fair calculation of the value of a battery can be guaranteed.

In the above described embodiments, the history information is stored in the nonvolatile memory 213 of the battery pack 200. However, the present disclosure is not limited to that, and the history data may be collectively stored in a data management company that collectively manages the information for evaluating battery values, for example. In the data management company, the battery value determination performed by the diagnosis device of each embodiment may be performed.

The respective functions described in the above embodiments may be formed by using hardware, or may be realized by a computer reading a program specifying the respective functions with the use of software. Alternatively, the respective functions may be formed by selecting software or hardware as needed.

Further, the respective functions may be realized by a computer reading a program stored in a recording medium (not shown). The recording medium in this embodiment may have any kind of recording format, as long as programs can be recorded in the recording medium and can be read by a computer.

The present disclosure is not limited to the above described embodiments, and modifications may be made to the components of them in a practical phase, without departing from the scope of the invention.

Also, various inventions can be developed by appropriately combining the components disclosed in the above described embodiments. For example, some of the components disclosed in the above embodiments may be eliminated. Further, components selected from two or more of the above embodiments may be combined where appropriate.

As described so far, the present disclosure can provide a method of determining the deterioration state of a battery with high precision, and rational present value indicators of a battery in accordance with the purpose of future use.

What is claimed is:

1. An apparatus comprising:
a resistance component determining unit that determines a solution resistance ($R_{SOL}$) and a charge transfer resistance ($R_{CT}$) of a battery;
a charge-discharge unit that performs step-down charging and discharging on a battery pack containing the at least one battery;
a battery capacity determining unit that determines battery capacities at respective C rates by operating the charge-discharge unit and controlling charging and discharging with a plurality of currents; and
a present value indicator calculating unit that acquires history information containing the battery capacities at the respective C rates representing characteristics of the battery and $R_{SOL}$ and $R_{CT}$, compares the history information with reference deterioration data to select deterioration data most similar to the reference deterioration data, turns a present deterioration state of the battery into numerical values with respect to the respective characteristics based on the selected deterioration data, weights the numerical values with coefficients according to a purpose of future use to generate new numerical values, and adds up the new numerical values to generate a present value indicator of the battery.

2. The apparatus according claim 1, further comprising:
an AC oscillator that sweeps AC voltages at a plurality of frequencies and applies the AC voltages to both ends of at least one battery; and
a voltage measuring unit and a current measuring unit that respectively measure a voltage change and a current change caused at the both ends of the at least one battery at each of the frequencies,
wherein the resistance component determining unit determines an impedance of the battery at each frequency as a complex representation from the measured voltage change and the measured current change at each of the frequencies, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation.

3. The apparatus according to claim 1, further comprising:
an AC oscillator that applies AC voltages having sine waves superimposed thereon at a plurality of frequencies, to both ends of at least one battery; and
a voltage measuring unit and a current measuring unit that respectively measure a voltage change and a current change caused at the both ends of the at least one battery with the applied AC voltages,
wherein the resistance component determining unit determines an impedance of the battery at each frequency as a complex representation by performing Fourier transformations on waveforms of the voltage change and the current change, and determines the solution resistance $R_{SOL}$ and the charge transfer resistance $R_{CT}$ of the battery so that an impedance of an equivalent circuit containing $R_{SOL}$ and $R_{CT}$ is fitted to the impedance in the complex representation.

4. An apparatus comprising:
a resistance component determining unit that determines a solution resistance $R_{SOL}$ and a charge transfer resistance $R_{CT}$ of a battery;
a charge unit that performs step-down charging on a battery pack containing the at least one battery;
a time information acquiring unit that controls charging with a plurality of step-down currents by operating the charge unit, and acquires information about time from an end of charging with a first current to an end of charging with a last current; and
a present value indicator calculating unit that acquires history information containing the time information representing characteristics of the battery and $R_{SOL}$ and $R_{CT}$, compares the history information with reference deterioration data to select deterioration data that is the most similar to the reference deterioration data, turns a present deterioration state of the battery into numerical values with respect to the respective characteristics based on the selected deterioration data, weights the numerical values with coefficients according to a purpose of future use to generate new numerical values, and adds up the new numerical values to generate a present value indicator of the battery.

5. A method comprising:
accumulating history information by connecting a diagnosis device to a battery and acquiring battery capacities at respective C rates and $R_{SOL}$ and $R_{CT}$, wherein C rate is a current value in which the battery nominal capacity can be discharged in one hour;
acquiring the history information containing the battery capacities at the respective C rates representing characteristics of the battery and $R_{SOL}$ and $R_{CT}$, comparing the history information with reference deterioration data to select deterioration data most similar to the reference deterioration data, and turning a present deterioration state of the battery into numerical values with respect to the respective characteristics, based on the selected deterioration data; and
weighting the numerical values with coefficients according to a purpose of future use, and adding up the new numerical values to create an indicator of a present value of the battery.

6. A method comprising:
accumulating history information by connecting a diagnosis device to a battery and acquiring time information and $R_{SOL}$ and $R_{CT}$;
acquiring the history information containing the time information representing characteristics of the battery and $R_{SOL}$ and $R_{CT}$, comparing the history information with reference to deterioration data to select deterioration data most similar to the reference deterioration data, and turning a present deterioration state of the battery into numerical values with respect to the respective characteristics, based on the selected deterioration data; and
weighting the numerical values with coefficients according to a purpose of future use, and adding up the new numerical values to create an indicator of a present value of the battery,
the time information being information about time from an end of charging with a first current to an end of charging with a last current, the time information being acquired by the diagnosis device controlling charging of the battery with a plurality of step-down currents.

* * * * *